United States Patent
Lee

(10) Patent No.: US 7,915,927 B2
(45) Date of Patent: Mar. 29, 2011

(54) OFFSET CANCELLATION CIRCUIT AND A METHOD THEREOF

(75) Inventor: Ki Hyuk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 136 days.

(21) Appl. No.: 12/342,304

(22) Filed: Dec. 23, 2008

(65) Prior Publication Data

US 2010/0090744 A1  Apr. 15, 2010

(30) Foreign Application Priority Data

Oct. 14, 2008  (KR) .................. 10-2008-0100551

(51) Int. Cl.
   *H03L 5/00* (2006.01)
(52) U.S. Cl. ............. 327/51; 327/307; 327/362
(58) Field of Classification Search .......... 327/362, 327/51, 378, 306–307
   See application file for complete search history.

(56) References Cited

U.S. PATENT DOCUMENTS

| | | | |
|---|---|---|---|
| 5,061,900 A * | 10/1991 | Vinn et al. | 330/9 |
| 6,194,941 B1 * | 2/2001 | Zarabadi et al. | 327/307 |
| 6,556,154 B1 * | 4/2003 | Gorecki et al. | 341/118 |
| 7,026,866 B2 | 4/2006 | Llewellyn | |
| 7,271,649 B2 | 9/2007 | Chiu et al. | |
| 2005/0184897 A1 | 8/2005 | Kim et al. | |

FOREIGN PATENT DOCUMENTS

KR   10-0480597 B1   3/2005
KR   1020060013123 A   2/2006

* cited by examiner

*Primary Examiner* — Dinh T. Le
(74) *Attorney, Agent, or Firm* — Ladas & Parry LLP

(57) ABSTRACT

An offset cancellation circuit includes a sense amplifier configured to receive an input signal and offset voltages and to generate an output signal. A compensation voltage generation section is configured to be inputted with the output signal, and the compensation voltage generation section increases or decreases compensation voltages until the voltage level of the output signal reaches a target voltage level. The voltage level of the compensation voltages is maintained and a control signal is enabled when the voltage level of the output signal reaches the target voltage level. A control loading section is configured to provide the compensation voltages as the offset voltages or maintains the current level of the offset voltages, according to the control signal.

19 Claims, 3 Drawing Sheets

OFFSET CANCELLATION CIRCUIT AND A METHOD THEREOF

CROSS-REFERENCES TO RELATED APPLICATION

The present application claims priority under 35 U.S.C. §119(a) to Korean patent application number 10-2008-0100551, filed on Oct. 14, 2008, in the Korean Intellectual Property Office, which is incorporated herein by reference in its entirety as set forth in full.

BACKGROUND

The present invention relates to a semiconductor memory apparatus, and more particularly, to an offset cancellation circuit of a semiconductor memory apparatus and a method thereof.

In a receiver circuit and a comparator circuit, which serve as chip interfaces of a semiconductor memory apparatus, offsets will undoubtedly occur due to mismatches in processes. Therefore, a typical semiconductor memory apparatus has an offset cancellation circuit for canceling the offsets occurring due to the mismatches so that the sensitivity characteristic and the resolution characteristic of the semiconductor memory apparatus can be improved.

FIG. 1 is a schematic block diagram showing a conventional offset cancellation circuit.

A conventional offset cancellation circuit 1 includes a sense amplifier 10, a control section 20 and a digital-analog converter 30. The sense amplifier 10 receives and amplifies an input signal 'in' and generates an output signal 'out'.

The control section 20 and the digital-analog converter 30 function to cancel the offset of the sense amplifier 10. When the voltage level of the output signal 'out' is below a target voltage level, the control section 20 generates a code signal 'code' and provides the code signal 'code' to the digital-analog converter 30. In response to the 'code', the digital-analog converter 30 generates offset voltages 'off+' and 'off−' and provides the offset voltages 'off+' and 'off−' to the sense amplifier 10. Conversely, if the voltage level of the output signal 'out' reaches the target voltage level, the control section 20 maintains the count of the generated code signal 'code' such that the offset voltages 'off+' and 'off−' generated by the digital-analog converter 30 maintain their voltage levels. Accordingly, the sense amplifier 10 can receive with the offset voltages 'off+' and 'off−' when the target voltage level is not reaches and can generate the output signal 'out' without an offset.

In more detail, the control section 20 has a counter that generates a code signal that is up-counted or down-counted. When the counting operation ends, the counter generates a set signal 'set'. The set signal 'set' is used in other circuits of a semiconductor memory apparatus.

Trends in the semiconductor industry are consistently moving towards high speed operation. Hence, the offset cancellation should also be quickly executed. As such, the digital-analog converter 30 should be able to quickly change the levels of the offset voltages in response to the code signal 'code' and should be able to maintain the levels of the offset voltages capable of canceling the offset in a stable manner. However, these two issues are in a trade-off relationship, and there is demand to simultaneously satisfy them both.

SUMMARY

Embodiment of the present invention include an offset cancellation circuit and a method thereof which can quickly implement offset cancellation and can stably maintain an offset cancellation result.

In one aspect, an offset cancellation circuit includes a sense amplifier configured to receive an input signal and offset voltages and to generate an output signal; a compensation voltage generation section configured to be inputted with the output signal, increase or decrease compensation voltages until a voltage level of the output signal reaches to a target voltage level, and maintain the compensation voltages and enable a control signal when the voltage level of the output signal reaches the target voltage level; and a control loading section configured to provide the compensation voltages as the offset voltages or maintain the offset voltages as they are, according to the control signal.

In another aspect, an offset cancellation circuit includes a sense amplifier configured to receive an input signal and offset voltages and to generate an output signal; and an offset voltage adjustment block configured to be inputted with the output signal, generate the offset voltages at output nodes, and adjust the capacitance of the output nodes depending upon whether a voltage level of the output signal reaches a target voltage level.

In still another aspect, an offset cancellation method suitable for generating offset voltages by receiving an output signal as feedback includes steps of decreasing capacitance of output nodes through which the offset voltages are outputted; increasing or decreasing the offset voltages until a voltage level of the output signal received as the feedback reaches a target voltage level; maintaining the offset voltages when the voltage level of the output signal reaches the target voltage level; and increasing capacitance of the output nodes when the voltage level of the output signal reaches the target voltage level.

BRIEF DESCRIPTION OF THE DRAWINGS

The above objects, and other features and advantages will become more apparent after a reading of the following detailed description taken in conjunction with the drawings, in which.

DETAILED DESCRIPTION

Figure 1:
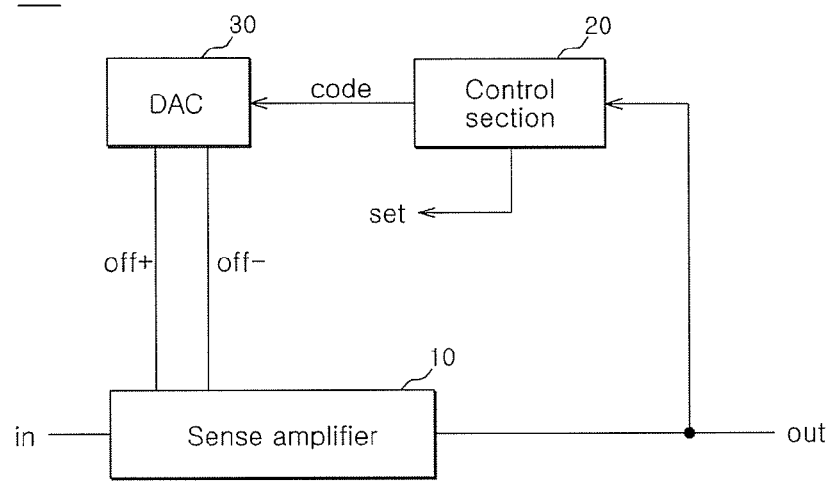
FIG. 1 is a schematic block diagram showing a conventional offset cancellation circuit.
Figure 2:
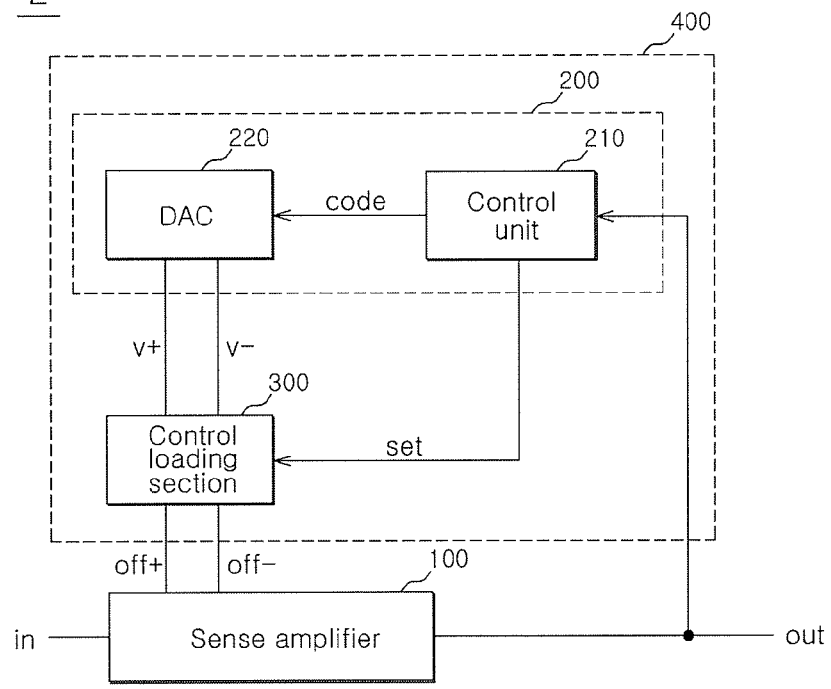
FIG. 2 is a schematic block diagram showing an offset cancellation circuit according to an embodiment of the present invention.

FIG. 2 is a schematic block diagram showing the configuration of an offset cancellation circuit according to an embodiment of the present invention.

An offset cancellation circuit 2 according to an embodiment of the present invention can include a sense amplifier 100, a compensation voltage generation section 200, and a control loading section 300. The sense amplifier 100 receives an input signal 'in' and offset voltages 'off+' and 'off−' and generates an output signal 'out'. The sense amplifier 100 may be an amplifier which amplifies a single-ended signal or a differential amplifier which amplifies a differential signal.

The compensation voltage generation section 200 can receive the output signal 'out' and generate compensation voltages 'v+' and 'v−' and a control signal 'set'. The compensation voltage generation section 200 receives the output signal 'out' and determines whether the voltage level of the output signal 'out' has reached a target voltage level. The compensation voltage generation section 200 can change the compensation voltages 'v+' and 'v−' until the voltage level of the output signal 'out' reaches the target voltage level. The compensation voltage generation section 200 can generate a positive compensation voltage 'v+' and a negative compensation voltage 'v−'. For example, in an initial state in which a voltage of +0.5V is generated as the positive compensation voltage 'v+' and a voltage of −0.5V is generated as the negative compensation voltage 'v−', if the voltage level of the output signal 'out' does not reach the target voltage level, a voltage of +0.4V can be generated as the positive compensation voltage 'v+' and a voltage of −0.4V can be generated as the negative compensation voltage 'v−'. When the voltage level of the output signal 'out' reaches the target voltage level, the compensation voltage generation section 200 can maintain the voltage levels of the compensation voltages 'v+' and 'v−' and enable the control signal 'set'.

The target voltage level is the desired logic level of the output signal 'out', which is generated by the sense amplifier 100 when the sense amplifier amplifies the input signal 'in'. For example, assuming that an input signal 'in' of a logic high level is applied to the sense amplifier 100, and the offset cancellation circuit 2 recognizes a voltage of no less than 1V as a logic high level. The sense amplifier 100 may generate an output signal 'out' that has a voltage level that is less than 1V until the offset is cancelled. When the offset is cancelled, the sense amplifier 100 can generate an output signal 'out' having a voltage level that is no less than 1V. That is to say, in this case, the output signal 'out' becomes the level of the target voltage level 1V. However, is should be understood that the present invention is not limited thereto, and therefore, it is to be understood that the target voltage level can be set to another value or even to be a range of values depending upon the application of the offset cancellation circuit 2.

The compensation voltage generation section 200 can include a control unit 210 and a digital-analog converter (DAC) 220. The control unit 210 receives the output signal 'out' that is output by the sense amplifier 100 and generates the code signal 'code' and the control signal 'set' according to the voltage level of the output signal 'out' when compared to the target voltage level. The control unit 210 can up-count or down-count the code signal 'code' until the voltage level of the output signal 'out' reaches the target voltage level. If the voltage level of the output signal 'out' reaches the target voltage level, the control unit 210 does not up-count or down-count the code signal 'code' (i.e., the control unit 210 maintains the code signal 'code' as is) and enables the control signal 'set'. As the control unit 210, a conventional counter can be employed. Thus, the control unit 210 generates a code signal that is up-counted or down-counted, and when it is no longer necessary to perform the counting operation anymore, the control unit 210 can generate a signal that notifies the end of the counting operation. The control signal 'set' can include the signal that notifies the end of the counting operation.

The digital-analog converter 220 can receive the code signal 'code' and generate the compensation voltages 'v+' and 'v−' based on the received code signal 'code'. For example, if the control unit 210 generates first through sixth code signals 'code0' through 'code5' as the code signal 'code' (with the respective code signals 'code0' through 'code5' being up-counted or down-counted), the digital-analog converter 220 can generate, for example, voltages of +0.5V through 0V as positive compensation voltage 'v+' and voltages of −0.5V through 0V as negative compensation voltage 'v−' depending upon which of the respective code signals 'code0' to 'code5' is received by the digital-analog converter 220. In other words, if the device is in, for example, an initial state, and the first code signal 'code0' is inputted to the digital-analog converter 220, the digital-analog converter 220 can generate a voltage of +0.5V as the positive compensation voltage 'v+' and a voltage of −0.5V as the negative compensation voltage 'v−'. If the second code signal 'code1' is inputted to the digital-analog converter 220, the digital-analog converter 220 can generate a voltage of +0.4V as the positive compensation voltage 'v+' and a voltage of −0.4V as the negative compensation voltage 'v−'. Of course, embodiments of the present invention are not limited solely to such an example. For example, alternatively, the voltages can be changed not by 0.1V but instead by 0.05V, and in this case, the number of the code signals that are generated by the control unit 210 can be doubled.

The control loading section 300 can be configured to receive the compensation voltages 'v+' and 'v−' and also the control signal 'set' and according to these signals can generate the offset voltages 'off+' and 'off−'. In response to the control signal 'set', the control loading section 300 can allow the compensation voltages 'v+' and 'v−' to be provided as the offset voltages 'off+' and 'off−' or can maintain the levels of the offset voltages 'off+' and 'off−' as they are. For example, if the control signal 'set' is disabled, the compensation voltages 'v+' and 'v−' can be provided as the offset voltages 'off+' and 'off−', and if the control signal 'set' is enabled, the offset voltages 'off+' and 'off−' can be maintained as they are.

Figure 3:
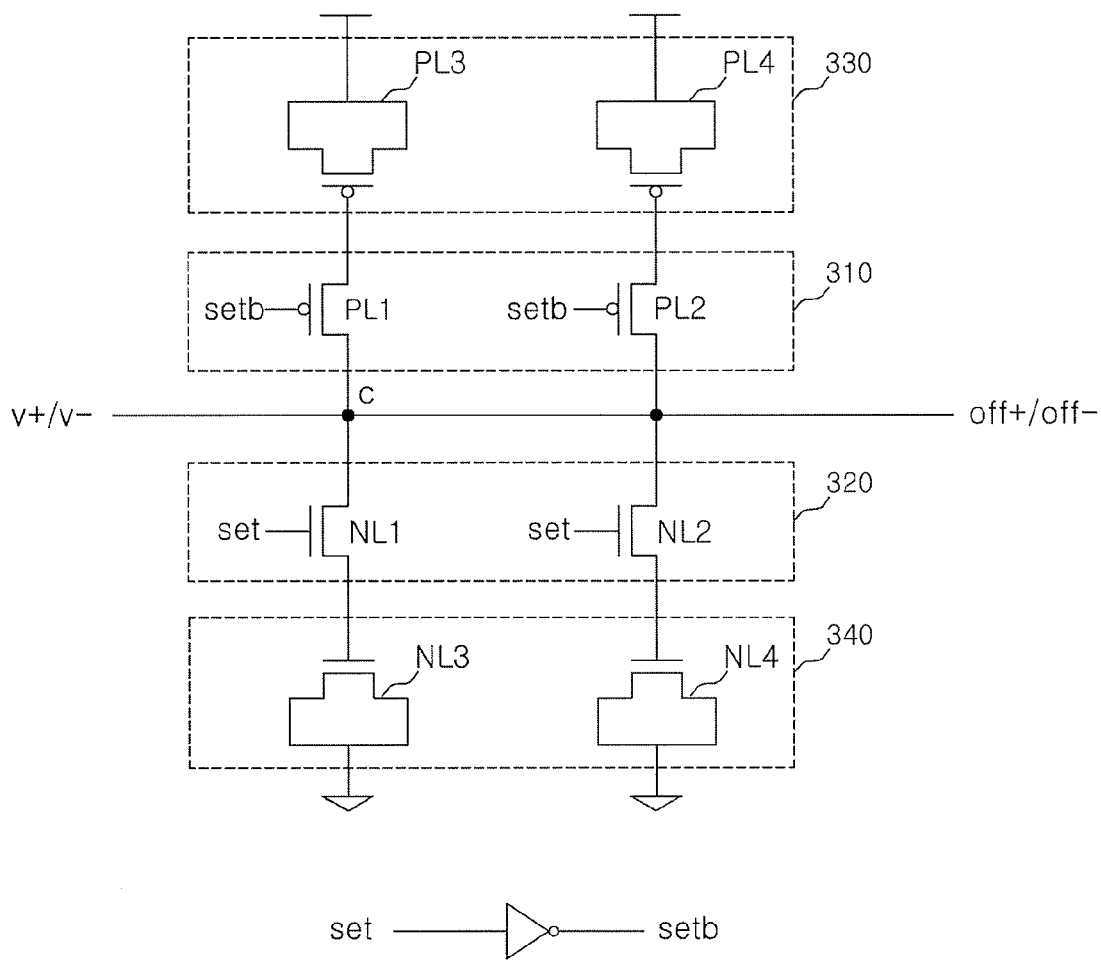
FIG. 3 is a schematic view showing the configuration of an embodiment of a control loading section capable of being implemented in the circuit of FIG. 2.

FIG. 3 is a schematic view showing an embodiment of the configuration of a control loading section 300 capable of being implemented in the circuit of FIG. 2. The control loading section 300 can include at least two pairs of units depending upon the number of compensation voltages 'v+' and 'v−' inputted thereto, and the number of the offset voltages 'off+' and 'off−' generated thereby. In an embodiment of the present invention, the control loading section 300 includes two pairs of units which are to receive the respective compensation voltages 'v+' and 'v−' and generate the respective offset voltages 'off+' and 'off−'. However, it should be appreciated that the present invention is not limited to only two pairs of units.

The control loading section 300 can include first and second switching units 310 and 320 and first and second loading units 330 and 340. The first and second switching units 310 and 320 are turned on or of according to the level of the control signals 'set' and 'setb', wherein the control signal 'setb' is obtained by inverting the control signal 'set'. The first loading unit 330 is connected to the first switching unit 310, and the second loading unit 340 is connected to the second switching unit 320. The control loading section 300 receives the compensation voltages 'v+' and 'v−' through output nodes c and generates the offset voltages 'off+' and 'off−' at the output nodes c. The first and second switching units 310 and 320 are connected to the output nodes c.

If the control signal 'set' is disabled, the first and second switching units 310 and 320 maintain a turned-off state (e.g., when the control signal 'set' is disabled at a low level, NMOS transistors NL1 and NL2 are off in response to the low level control signal 'set' and PMOS transistors PL1 and PL2 are off in response to the high level inverted control signal 'setb'). Therefore, the control loading section 300 does not provide any capacitance to the output nodes c. Accordingly, the control loading section 300 allows the compensation voltages 'v+' and 'v−' to be quickly provided as the offset voltages 'off+' and 'off−'. That is, the change of the offset voltages 'off+' and 'off−' can quickly occur due to the change of the compensation voltages 'v+' and 'v−'.

If the control signal 'set' is enabled, the first and second switching units 310 and 320 are turned on. If the first and second switching units 310 and 320 are turned on, the output nodes c are connected to the first and second loading units 330 and 340, and the output nodes c begin to have large capacitance as the output nodes c are connected to the first and second loading units 330 and 340. Accordingly, the control loading section 300 can maintain the offset voltages 'off+' and 'off−' as they are in a stable manner irrespective of any change in the compensation voltages 'v+' and 'v−'.

In an embodiment of the present invention, the first switching unit 310 can include first and second switching PMOS transistors PL1 and PL2, and the second switching unit 320 can include first and second switching NMOS transistors NL1 and NL2. The first and second switching PMOS transistors PL1 and PL2 receive the control signal 'setb' obtained by inverting the control signal 'set' via the gates thereof, and the first and second switching PMOS transistors PL1 and P12 are turned on/off depending upon whether the control signal 'set' is enabled or disabled. The first and second switching NMOS transistors NL1 and NL2 receive the control signal 'set' via the gates thereof, and the first and second switching NMOS transistors are also turned off/on depending upon whether the control signal 'set' is enable or disabled. The first loading unit 330 can include first and second loading PMOS transistors PL3 and PL4, and the second loading unit 340 can include first and second loading NMOS transistors NL3 and NL4. While it was exemplified in the embodiment that each of the switching units 310 and 320 and the loading units 330 and 340 includes two transistors, the embodiment is not limited thereto, and it is to be understood that the number of the transistors included in each of the switching units 310 and 320 and the loading units 330 and 340 can be increased or decreased so that the capacitance of the output nodes c can be adjusted.

Figure 4:
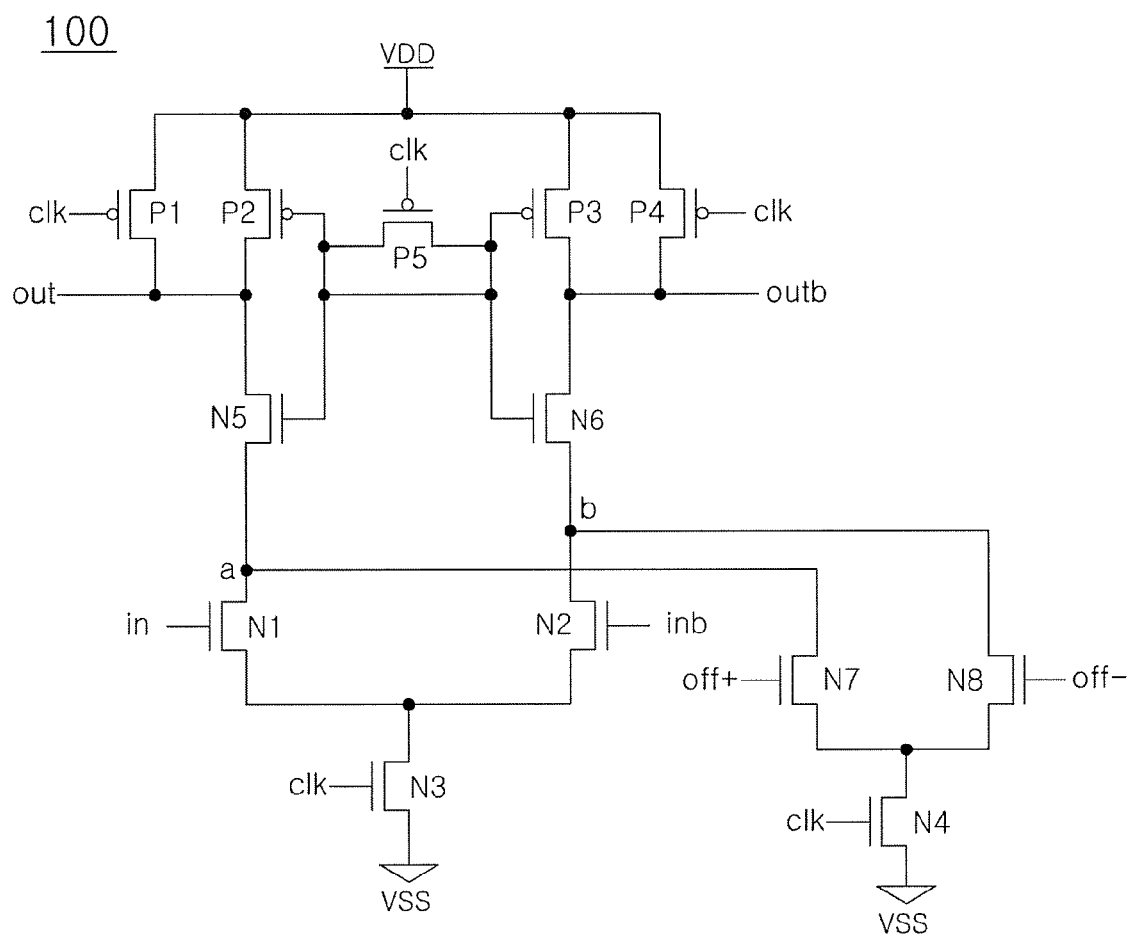
FIG. 4 is a schematic view showing the configuration of an embodiment of a sense amplifier capable of being implemented in the circuit of FIG. 2.

FIG. 4 is a schematic view showing a configuration of the sense amplifier according to an embodiment of the present invention capable of being implemented in the circuit of FIG. 2. The sense amplifier 100 can include first through fifth PMOS transistors P1 through P5 and first through eighth NMOS transistors N1 through N8. The sense amplifier 100 can comprise a differential amplifier which receiving a pair of input signals 'in' and 'inb' and outputs a pair of output signals 'out' and 'outb'. Offset cancellation of the sense amplifier 100 is required because of, for example, the different sizes and threshold voltages of the first and second NMOS transistors N1 and N2, which receive the input signals 'in' and 'inb'. In order to eliminate the differences, the offset voltages 'off+' and 'off−' are applied via a first node a and a second node b. If the offset of the sense amplifier 100 is cancelled through the application of the offset voltages 'off+' and 'off−', the output signals 'out' and 'outb', which are generated at opposite levels, can be generated by differentially amplifying the input signals 'in' and 'inb'. If the offset of the sense amplifier 100 is not properly cancelled, the output signals 'out' and 'outb' are not properly amplified, and if the offset of the sense amplifier 100 is properly cancelled, the output signals 'out' and 'outb' are outputted in the state in which they each reach a different target voltage level (for example, a logic high level in the case the output signal 'out' and a logic low level in the case of the output signal 'outb').

Hereinbelow, the operation of the offset cancellation circuit 2 according to an embodiment of the present invention will be described with reference to FIGS. 2 through 4.

The sense amplifier 100 receives the input signals 'in' and 'inb' and generates the output signals 'out' and 'outb'. When the offset of the sense amplifier 100 is not cancelled, the output signals 'out' and 'outb' are outputted in the state in which they are not amplified to the target voltage levels. The control unit 210 initially generates the first code signal 'code0' and outputs the first code signal 'code0' as the code signal, and the control unit 210 outputs a disabled control signal 'set'. Then, if the output signals 'out' and 'outb' are still not amplified to the target voltage levels (i.e., the voltage levels of the output signals 'out' and 'outb' do not correspond to the target voltage levels), the control unit 210 generates the second code signal 'code1' and outputs the second code signal 'code1' as the code signal 'code', and the control unit 210 the control signal 'set' such that it maintains a disabled state. In more detail, when the first code signal 'code0' is inputted, the digital-analog converter 220 can generate voltages of +0.5V and −0.5V as the positive compensation voltage 'v+' and the negative compensation voltage 'v−'. Then, if the second code signal 'code1' is inputted, the digital-analog converter 220 can generate the voltages of +0.4V and −0.4V as the positive compensation voltage 'v+' and the negative compensation voltage 'v−'.

The control unit 210 can increase or decrease the compensation voltages 'v+' and 'v−' by up-counting or down-counting the code signal 'code' until the offset of the sense amplifier 100 is cancelled, that is, the voltage levels of the output signals 'out' and 'outb' reach the target voltage levels. Also, the control unit 210 maintains a disabled state of the control signal 'set' until the voltage levels of the output signals 'out' and 'outb' reach the target voltage levels. Because the first and second switching units 310 and 320 of the control loading section 300, which receive the disabled control signal 'set' when the output signals have not reached the target voltage levels, are turned off, the capacitance of the first and second loading units 330 and 340 does not exert any influence on the output nodes c. Thus, the control loading section 300 directly provides the compensation voltages 'v+' and 'v−' as the offset voltages 'off+' and 'off−'.

The above procedure can be repeated until the offset of the is sense amplifier 100 is cancelled, that is, the voltage levels of the output signals 'out' and 'outb' reach the target voltage levels, and once the output signals 'out' and 'outb' reach the target voltage levels, the control unit 210 maintains the code signal 'code', which has been previously up-counted or down-counted to cancel the offset, as it currently is, and enables the control signal 'set'. For example, if the compensation voltages 'v+' and 'v−' of +0.4V and −0.4V are provided as the offset voltages 'off+' and 'off−' and thereby the offset of the sense amplifier 100 is cancelled, the control unit 210 enables the control signal 'set', and at the same time maintains the second code signal 'code1' as it is.

Thereupon, the first and second switching units 310 and 320 of the control loading section 300 will receive an enabled control signal 'set', and therefore the first and second switching units 310 and 320 are turned on so that the capacitance of the first and second loading units 330 and 340 is applied to the output nodes c. Hence, the offset voltages 'off+' and 'off−' can be outputted in a stable manner from the output nodes c while having preset levels.

As a result, embodiments of the present invention provide advantages in that a change in the offset voltages can quickly occur during an offset canceling process, and after the offset canceling process has been completed, the offset voltages can be maintained as they are in a stable manner.

An offset cancellation circuit 2 according to another embodiment can include a sense amplifier 100 and an offset voltage adjustment block 400. Referring to FIG. 2, the compensation voltage generation section 200 can serve as an offset voltage generation section 200, and the offset voltage generation section 200 and the control loading section 300 can be included in the offset voltage adjustment block 400. The offset voltage adjustment block 400 can receive an output signal 'out' and generate offset voltages 'off+' and 'off−' at output nodes. The offset voltage adjustment block 400 can be configured to adjust the capacitance of the output nodes depending upon whether the voltage level of the output signal 'out' has reached a target voltage level.

An offset cancellation method according to another embodiment of the present invention, generates offset voltages 'off+' and 'off−' by receiving an output signal 'out' as a feedback signal. The offset cancellation method includes decreasing the capacitance of an output nodes through which the offset voltages 'off+' and 'off−' are outputted; increasing or decreasing the offset voltages 'off+' and 'off−' until the voltage level of the output signal 'out' received as a feedback reaches a target voltage level; maintaining the offset voltages 'off+' and 'off−' when the voltage level of the output signal 'out' reaches the target voltage level; and increasing the capacitance of the output nodes when the voltage level of the output signal 'out' reaches the target voltage level.

After the offset voltages 'off+' and 'off−' are increased or decreased such that the voltage level of the output signal 'out' reaches a target voltage level, and the increased or decreased offset voltages 'off+' and 'off−' are then stabilized. For example, when the offset voltages 'off+' and 'off−' of +0.5V and −0.5V are generated, if the voltage level of the output signal 'out' does not reach the target voltage level, the offset voltages 'off+' and 'off−' can be decreased to +0.4V and −0.4V (of course, the embodiment is not limited thereto, and the offset voltages 'off+' and 'off−' can be, for example, increased or decreased by a different level). Therefore, stabilizing the increased or decreased offset voltages 'off+' and 'off−' means that a delay time is given until the offset voltages 'off+' and 'off−' are decreased from +0.5V and −0.5V and are stabilized at +0.4V and −0.4V.

Increasing or decreasing the offset voltages 'off+' and 'off−' until the voltage level of the output signal 'out' reaches the target voltage level can include receiving the output signal 'out' and generating a code signal 'code' that is to be up-counted or down-counted, and can also include the increasing or decreasing the offset voltages 'off+' and 'off−' in response to the code signal 'code'. For example, when +0.5V and −0.5V are generated as the offset voltages 'off+' and 'off−', if the voltage level of the output signal 'out' does not reach the target voltage level, offset voltages 'off+' and 'off−' decreased to +0.4V and −0.4V can be generated by generating a down-counted code signal 'code'. Of course, increased offset voltages 'off+' and 'off−' can be generated by generating an up-counted code signal 'code'.

In the offset cancellation method according to an embodiment of the present invention, the calibration and cancellation of an offset can be quickly carried out by decreasing the capacitance of output nodes for outputting offset voltages, and after the offset is cancelled, changed offset voltages can be stably maintained by increasing the capacitance of the output nodes.

Although an exemplary embodiment has been described for illustrative purposes, those skilled in the art will appreciate that various modifications, additions and substitutions are possible, without departing from the scope and the spirit as disclosed in the accompanying claims.

What is claimed is:

1. An offset cancellation circuit comprising:
 a sense amplifier configured to receive an input signal and offset voltages in order to generate an output signal;
 a compensation voltage generation section configured to receive the output signal and configured to increase or decrease compensation voltages until a voltage level of the output signal reaches a predetermined target voltage level, wherein the compensation voltage generation unit is configured to maintain the compensation voltages and enable a control signal when the voltage level of the output signal reaches the target voltage level; and
 a control loading section configured to receive the compensation voltages and the control signal and configured to provide the received compensation voltages as the offset voltages or to maintain the offset voltages as they are depending upon the control signal.

2. The offset cancellation circuit according to claim 1, wherein the compensation voltage generation section comprises:
 a control unit configured to receive the output signal and to generate a code signal and the control signal; and
 a digital-analog converter configured to generate the compensation voltages according to the code signal.

3. The offset cancellation circuit according to claim 1, wherein the control loading section provides the received compensation voltages as the offset voltages when the control signal is disabled and maintains the offset voltages as they are when the control signal is enabled.

4. The offset cancellation circuit according to claim 1, wherein the control loading section receives the compensation voltages through output nodes and generates the offset voltages at the output nodes.

5. The offset cancellation circuit according to claim 4, wherein a capacitance is applied to the output nodes when the control signal is enabled to stabilize and maintain the offset voltages.

6. The offset cancellation circuit according to claim 4, wherein the control loading section comprises:
 first and second loading units;
 a first switching unit configured to be turned on according to the control signal to connect the output nodes to the first loading unit; and
 a second switching unit configured to be turned on according to the control signal to connect the output nodes to the second loading unit.

7. The offset cancellation circuit according to claim 6, wherein a capacitance of the first and second loading units is applied to the output nodes when the first and second switching units are turned on to stably maintain the offset voltages.

8. An offset cancellation circuit comprising:
 a sense amplifier configured to receive an input signal and offset voltages in order to generate an output signal; and
 an offset voltage adjustment block configured to receive the output signal and to generate the offset voltages at output nodes, and configured to increase or decrease a capacitance of loading capacitors coupled to the output nodes depending upon whether a voltage level of the output signal reaches a target voltage level.

9. The offset cancellation circuit according to claim 8, wherein the offset voltage adjustment block comprises:
 an offset voltage generation section configured to receive the output signal and to generate the offset voltages and a control signal according to the voltage level of the output signal; and
 a control loading section configured to increase or decrease the capacitance of the output nodes according to the control signal.

10. The offset cancellation circuit according to claim 9, wherein the offset voltage generation section increases or decreases the offset voltages until the voltage level of the output signal reaches the target voltage level, and maintains the offset voltages as they are and enables the control signal when the voltage level of the output signal reaches the target voltage level.

11. The offset cancellation circuit according to claim 9, wherein the offset voltage generation section comprises:
   a control unit configured to receive the output signal and to generate the control signal according to the voltage level of the output signal; and
   a digital-analog converter configured to generate compensation voltages according to a code signal that is generated according to the voltage level of the output signal.

12. The offset cancellation circuit according to claim 9, wherein the control loading section does not provide capacitance to the output nodes when the control signal is disabled, and provides capacitance to the output nodes when the control signal is enabled.

13. The offset cancellation circuit according to claim 9, wherein the control loading section comprises:
   first and second loading units;
   a first switching unit configured to be turned on according to the control signal to connect the output nodes to the first loading unit; and
   a second switching unit configured to be turned on according to the control signal to connect the output nodes to the second loading unit.

14. The offset cancellation circuit according to claim 13, wherein a capacitance of the first and second loading units is applied to the output nodes when the first and second switching units are turned on to adjust the capacitance of the output nodes.

15. An offset cancellation method for generating offset voltages by receiving an output signal as feedback, the method comprising steps of:
   increasing or decreasing the offset voltages until a voltage level of the output signal received as the feedback reaches a target voltage level;
   maintaining the offset voltages when the voltage level of the output signal reaches the target voltage level; and
   increasing a capacitance of the output nodes when the voltage level of the output signal reaches the target voltage level.

16. The offset cancellation method according to claim 15, wherein, after the step of increasing or decreasing the offset voltages, the method further comprises the step of:
   stabilizing levels of the increased or decreased offset voltages.

17. The offset cancellation method according to claim 15, wherein the step of increasing or decreasing the offset voltages until the voltage level of the output signal reaches the target voltage level comprises the steps of:
   receiving the output signal and generating a code signal that is to be up-counted or down-counted; and
   increasing or decreasing the offset voltages in response to the count of the code signal.

18. The offset cancellation method according to claim 15, further comprising the step of enabling a control signal when the output signal received as the feedback reaches a target voltage level, wherein the capacitance of the output nodes is increased in response to the control signal.

19. The offset cancellation method according to claim 15, further comprising the step of decreasing the capacitance of the output nodes through which the offset voltages are outputted.

* * * * *